United States Patent
Matheson

(10) Patent No.: US 9,586,262 B2
(45) Date of Patent: *Mar. 7, 2017

(54) MANUFACTURING AND APPLICATIONS OF METAL POWDERS AND ALLOYS

(71) Applicant: Boston Electronic Materials, LLC, Belmont, MA (US)

(72) Inventor: Andrew Matheson, Belmont, MA (US)

(73) Assignee: Boston Electronic Materials LLC, Belmont, MA (US)

( * ) Notice: Subject to any disclaimer, the term of this patent is extended or adjusted under 35 U.S.C. 154(b) by 349 days.

This patent is subject to a terminal disclaimer.

(21) Appl. No.: 14/215,191

(22) Filed: Mar. 17, 2014

(65) Prior Publication Data

US 2014/0199202 A1 Jul. 17, 2014

Related U.S. Application Data

(63) Continuation of application No. 13/350,854, filed on Jan. 16, 2012, now Pat. No. 8,673,051, which is a continuation of application No. PCT/US2010/042209, filed on Jul. 16, 2010.

(60) Provisional application No. 61/345,823, filed on May 18, 2010, provisional application No. 61/226,367, filed on Jul. 17, 2009.

(51) Int. Cl.
   B22F 9/24    (2006.01)
   B22F 1/02    (2006.01)
   C23C 14/34   (2006.01)
   H01G 9/042   (2006.01)
   B22F 3/10    (2006.01)

(52) U.S. Cl.
   CPC ............... B22F 9/24 (2013.01); B22F 1/02 (2013.01); B22F 3/10 (2013.01); C23C 14/3414 (2013.01); H01G 9/042 (2013.01)

(58) Field of Classification Search
   CPC ...... B22F 1/02; B22F 3/10; B22F 9/24; C23C 14/3414
   USPC .............................. 75/331; 419/30
   See application file for complete search history.

(56) References Cited

U.S. PATENT DOCUMENTS

| | | | |
|---|---|---|---|
| 2,823,991 | A | 2/1958 | Kamlet |
| 2,847,297 | A | 8/1958 | Pietro et al. |
| 3,847,596 | A | 11/1974 | Holland et al. |
| 4,725,312 | A | 2/1988 | Seon et al. |
| 4,820,339 | A | 4/1989 | Bienvenu |
| 4,954,169 | A | 9/1990 | Behrens |
| 5,259,862 | A | 11/1993 | White et al. |
| 7,914,600 | B2 * | 3/2011 | Withers ............... B22F 9/28 75/366 |
| 8,673,051 | B2 * | 3/2014 | Matheson ............ B22F 1/02 75/228 |
| 2007/0181435 | A1 | 8/2007 | Ogasawara et al. |

FOREIGN PATENT DOCUMENTS

| | | |
|---|---|---|
| JP | 5343017 A | 4/1978 |
| JP | 0873906 A | 3/1996 |
| JP | 08-295955 A | 11/1996 |

OTHER PUBLICATIONS

International Search Report issued Feb. 15, 2011 in PCT Application No. PCT/US2010/042209.
JP Office Action Translation for Appln. No. 2012-520804.

* cited by examiner

*Primary Examiner* — Jie Yang

(57) ABSTRACT

The present invention is directed to a method of manufacture of metal or alloy powders that uses liquid phase reduction of a metal halide, or a mixture of metal halides, to produce a metal particle coated in salts produced as a reaction byproduct. The reaction conditions can be chosen to select a range of metal particle sizes, and the salt coating prevents oxidation (or reaction with other atmospheric gases) and permits a range of applications hitherto difficult to achieve using metal powders.

18 Claims, No Drawings

MANUFACTURING AND APPLICATIONS OF METAL POWDERS AND ALLOYS

CROSS-REFERENCE TO RELATED APPLICATIONS

This application is a continuation of application U.S. Ser. No. 13/350,854 filed Jan. 16, 2012, now U.S. Pat. No. 8,673,051. The '854 application is a continuation of PCT Application No. PCT/US2010/042209 filed 16 Jul. 2010 and published in the English language as PCT Publication No. WO 2011/009014 on 20 Jan. 2011. The PCT Application claims priority from U.S. Provisional Patent Application Ser. No. 61/226,367, filed 17 Jul. 2009 and from U.S. Provisional Patent Application Ser. No. 61/345,823, filed 18 May 2010. The disclosures of all of these documents are hereby incorporated herein by reference.

FIELD OF THE INVENTION

This invention relates to the production of metal powders and to applications of these metal powders.

BACKGROUND OF THE INVENTION

Metal powders possess utility in many applications. However, the ability to exploit these powders can be limited when their surfaces are coated in oxide films (and when other gases are present at the particle surface or within the body of the particles). In particular, applications making use of metal powders can be limited because of the oxygen content present in the powders and its influence upon metal sintering and other characteristics.

In this invention, a method of manufacture is described that uses liquid phase reduction of a metal halide, or a mixture of metal halides, to produce a metal particle, coated in salts produced as a reaction byproduct. The reaction conditions can be chosen to select a range of metal particle sizes, and the salt coating prevents oxidation (or reaction with other atmospheric gases) and permits a range of applications hitherto difficult to achieve using metal powders.

In the text below, it is to be understood that "metal" means at least one and potentially more than one metal element, and that "metal halide" means at least one and potentially more than one distinct metal halide. Furthermore, "reductant" means the reducing medium in which the metal halides are reduced to metal powders.

SUMMARY OF THE INVENTION

As described above, the present invention is directed to a method of manufacture of metal or alloy powders that uses liquid phase reduction of a metal halide, or a mixture of metal halides, to produce a metal particle coated in salts produced as a reaction byproduct. The reaction conditions can be chosen to select a range of metal particle sizes, and the salt coating prevents oxidation (or reaction with other atmospheric gases) and permits a range of applications hitherto difficult to achieve using metal powders.

One embodiment of the invention is directed to a process for the production of powder metallurgical components comprising the steps of:

(a) reducing a mixture of at least one metal halide by molten metal reduction of the liquid phase of the metal halide in a reductant selected from an alkali or alkaline earth metal, wherein the molten reductant is present as a stoichiometric excess to the metal halide, thereby forming reaction products in a salt coating comprising molten metal, metal halide, and free metallic reductant;

(b) separating the reaction products formed in step (a); and (c) forming a metal powder from a reaction product in step (b);

wherein the at least one metal halide mixture comprises a mixture of metal chlorides and the reductant is metallic sodium;

wherein the process is conducted as a one-pass operation in which the molten sodium metal is reacted with a liquid metal halide and the solids are recovered with only the molten sodium metal being intentionally recirculated; and wherein one or more powder metallurgical components are formed from the metal powder using powder metallurgical processing techniques.

In certain embodiments, the process further comprises the step of sintering the metal powder by one of the following methods:

(a) with the salt coating in place;

(b) after removing the salt coating in such a manner as to avoid exposing the metal powder to deleterious gaseous contamination; or (c) by removing the salt coating with a suitable solvent and then processing the metal powder to remove any surface contamination brought about by exposure to the solvent.

In certain embodiments, the reductant metallic sodium comprises at least 0.1% free metallic sodium by weight and the metal halide comprises silicon.

In certain embodiments, the metal powder comprises silicon.

In certain embodiments, the metallurgical component includes an anode.

In certain embodiments, the metal powder comprises a silicon alloy.

In certain embodiments, the reductant metallic sodium comprises at least 1% free metallic sodium by weight and the metal halide comprises silicon.

In certain embodiments, the metal powder comprises a valve metal or a valve metal alloy. Specific valve metal or valve metal alloys include tantalum, niobium, aluminum, and alloys thereof, and aluminum-silicon alloys.

In certain embodiments, the powder metallurgical components are porous.

In certain embodiments, the powder metallurgical components are non-porous.

In certain embodiments of the invention, a capacitor is produced from the anode of the invention.

In certain embodiments of the invention, a metal sheet or wafer is produced from the metal powder produced by the process.

In certain embodiments of the invention, a sputtering target is produced from the metal powder produced by the process.

DETAILED DESCRIPTION OF THE INVENTION

As described above, the present invention relates to the production of metal powders and to their applications in a range of uses, for which the production process is particularly well-suited and also economically advantageous. One embodiment of a process of the present invention comprises:

(a) introducing the liquid metal halide into a reactor vessel containing a reductant, preferentially an alkali or alkaline earth metal, more preferentially an alkaline earth metal, and most preferentially sodium metal, in which the level of reductant is controlled to remain within predetermined limits and such that the reductant is always in stoichiometric excess to the metal halide;

(b) separating the reaction product (a mixture of the metal, the reductant halide or halides, and excess reductant) from the reductant in the reactor vessel.

The metal thus produced is in the form of a metal powder encapsulated in a salt or salts. Typical salts are NaCl and other alkali or alkaline earth salts. Depending on the application in mind, the metal powder can be separated from the salt/salts, or else can be further processed while encapsulated in the salt/salts.

The particle size produced by this process is controlled by a number of factors, including the reaction temperature, the flow rates of the reagents, and the specific metal or metals being processed. The ability to select particle size is an important and attractive aspect of the present invention.

The metal produced by this methodology is well suited to the production of powder metallurgical parts, components and devices, because it can be sintered to form a solid part without inclusion of oxygen, nitrogen or other gases, all of which can have deleterious effects on the metallurgical properties of metallurgical parts, components and objects formed through powder metallurgical techniques. Processing is possible either with the salt coating in place, or after removing the salt coating in such a manner as to avoid exposing the metal powder to deleterious gaseous contamination, or by removing the salt coating with a suitable solvent (for example, water) and then processing the metal powder to remove any surface contamination brought about by exposure to the solvent.

The metal produced by this methodology is also well suited to the formation of porous structures, in which the salt-coated metal particles are pressed together until the metal particles make physical contact with each other. The material can then be sintered and subsequently washed, to produce a porous object.

The metal produced by this methodology is also well suited to the formation of metal coatings and sheets. The salt-coated particles can be applied to a substrate, and then the salt coating can be removed to leave a coating of metal powder (which can be sintered to form a sheet or coating), or a coating of metal if the salt removal is accomplished at high enough temperatures to sinter the metal within the salt coating.

The metal produced by this methodology is also well suited to the formation of metal parts, components and objects, by pressing and sintering the metal powder to the desired final product shape, using the well-known techniques of powder metallurgy.

The salt coating of the metal particles can be removed, for example by water washing, to produce a metal powder in which the surface of the powder is coated with the metal oxide. This powder can be further processed, for example into: powder metallurgical parts, objects and components; porous components and anodes; coatings or sheets, with a deoxidation step prior to sintering of the metal, or else exploitation of the lower melting point of the oxide to sinter the powder in the presence of its oxide. The salt coating can also be removed by heating the metal particles to above the boiling point of the salt (a process that can be accelerated by application of a vacuum) and also by applying pressure to the metal to squeeze off the salt. The precise choice of method(s) to remove the salt depends on the choice of end product and desired metallic purity, and will be apparent to those skilled in the art.

Binders can be added to the metal powder to enhance processing characteristics, for example to improve the ability to cast thick films of the metal. The binder should be chosen such that it can be removed from the metal by heating or other means in such a way as to avoid oxidation of the metal surface.

Finally, all the processes described herein can be accomplished using a gas phase reductant in place of the preferred liquid phase reductant.

Thus, one embodiment of the present invention is a process to reduce mixtures of at least one metal halide by molten metal reduction of the liquid phase metal halide in an alkali or alkaline earth metal. Preferably, at least one metal halide mixture is a mixture of metal chlorides and the reductant is metallic sodium. Preferably, the reaction product of the process will include at least one metal mixture, a salt coating, and at least 0.1% metallic sodium. More preferably, the reaction product of the process will include at least one metal mixture, a salt coating, and at least 1% metallic sodium. In addition, excess sodium can be removed from the reaction products.

Another embodiment of the present invention is the use of these reaction products to form powder metallurgical components, such as an anode. Preferably for anodes, valve metals, or valve metal alloys are employed. Suitable valve metals include tantalum, niobium, aluminum, and alloys thereof, as well as aluminum-silicon alloys.

Another embodiment of the present invention is the use of these reaction products to form a capacitor produced from the anode.

Another embodiment of the present invention is the use of these reaction products to form a metal sheet or wafer from the metal powder produced by the process.

Another embodiment of the present invention is the use of these reaction products to form a sputtering target from the metal powder produced by the process.

As described above, metal halides can be injected as liquids into a stoichiometric excess of molten reductant, and reduced therein to the metal, as a particle coated in reductant halide. The typical size of the metal particle is a function of the temperature of the reaction, the flow rates of the reagents, and the diffusion characteristics of the metal. By careful control of the reaction conditions, one can select for a range of typical metal particle sizes. The surface area of the metal is related to the particle size, and the surface area of the metal particle determines many important physical characteristics of the metal in commercial applications.

The elemental composition of the metal particle can be chosen by selecting the ratio of metal halides and mixing them prior to injection into the reductant. Wide ranges of metal alloys can be produced in this manner.

The reaction produces a metal powder coated in a halide salt, incorporating a fraction of the reductant. This reaction product can be removed from the reactor and then an either be treated to remove the salt and reductant, or can first be treated to passivate the reductant.

In the latter case, the reductant can be passivated by a range of means including chlorination (or halogenation using other halogens) as well as thermal processing to evaporate the metal at temperatures above its boiling point.

Depending on the commercial application, the reaction product can then be processed together with its salt coating, or can be treated to remove the salt coating prior to use in applications. There are many commercial applications of this technology, illustrated by the following representative but non-exhaustive examples:

EXAMPLE 1

Iron, neodymium and boron chlorides are mixed in a stoichiometric ratio suitable for the production of neodymium iron boron magnets. The chlorides are injected as liquids into a stoichiometric excess of molten sodium, at a temperature in the range of 150° C. to 700° C.

The metal particles thus produced are an alloy of iron, neodymium and boron, coated in sodium chloride. The metal particles can be separated from the molten sodium, for example by passing the sodium through a filter of a size effective in the separation of the molten sodium from the salt-coated metal particles.

The metal particles can then be treated to remove the salt coating, for example by heating the salt-coated particles to above the melting point of the salt and then filtering the metal particles, for example on a belt filter to remove the molten salt. The salt coating can also be removed by applying pressure to the metal powder, thus causing the salt to flow and separate from the metal powder.

Next, the metal particles can be pressed and heated, to remove the remaining salt and sinter the metal powders into a solid object of the desired shape.

EXAMPLE 2

Aluminum chloride is melted and injected into a stoichiometric excess of molten sodium at a temperature controlled to remain below the melting point of aluminum. The reaction produces aluminum particles with a coating of sodium chloride, and these can be filtered from the sodium for example in the manner described in Example 1 above.

After separation, the salt-coated aluminum particles are heated to 500° C. to 600° C. and exposed to a full or partial (inert atmosphere) vacuum to remove traces of sodium, which will evaporate and can be collected for disposal or re-use.

Next, the aluminum particles can be pressed, within their salt coating, to form a desired shape. Under pressure, and at temperatures below the melting point of aluminum, the salt will flow and separate from the aluminum, thereby removing the salt coating from the aluminum metal. Finally, the aluminum metal can be heated to sinter it into a solid object, and can be washed with a solvent (e.g., water) to remove any traces of surface salt.

EXAMPLE 3

A mixture of aluminum and silicon chlorides, in which the aluminum to silicon ratio is at least 1:1 and preferentially greater than 3:1, is injected into a stoichiometric excess of molten sodium at a temperature below the boiling point of molten sodium.

The metal particles thus formed, comprising an alloy of silicon and aluminum can be separated from the molten sodium using, for example, the methodology of Example 1 above. Excess sodium can then be removed under vacuum as described in Example 2.

The metal particles can then be pressed, both to remove the salt (which will flow under pressure) and to produce the desired shape of final metal product (for example, automotive engine parts). The metal product can then be heated to sinter the metal and can be washed with a suitable solvent to remove any remaining surface salt contamination.

EXAMPLE 4

The metal powder of Examples 2 or 3 can be pressed into the form factor of an anode, by applying sufficient pressure to the powder to cause the metal particles to touch each other, while leaving a salt-filled porous structure within the anode form factor.

Next, sufficient energy can be supplied to cause the metal particles to fuse, thereby creating a single, connected metal structure within the form factor of the anode. In this step the energy supplied should be limited to avoid destroying the pore structure represented by the salt within the anode structure.

Third, the anode structure thus formed can be washed in a suitable solvent, for example water, to remove the salt and (dependent on the choice of solvent) to passivate via oxidation the surface of the metal within the anode structure.

The anode produced in this manner can then be further processed into a capacitor, in which the capacitance of the capacitor is determined by the particles size of the metal powder and the formation voltage to which the capacitor is formed.

EXAMPLE 5

Tantalum and silicon chlorides, mixed in the metallic ratio 1:2, are injected into molten sodium at a temperature below the boiling point of molten sodium, to form tantalum silicide metal particles coated in salt. These particles can be removed from the sodium for example according to the methodology of Example 1.

Excess sodium can be removed from the particles by heating to 500° C. to 700° C. under a full or partial vacuum. Alternatively, chlorine gas can be used at temperatures below 400° C. to convert excess sodium chemically into sodium chloride.

Next, the metal particles can be pressed into a form suitable for use as a sputtering target, for applications including semiconductor fabrication. The pressing process removes the excess salt, and the pressure applied should be sufficient to compact the metal powder into a solid object.

The solid metal powder form is next sintered, or can be hot pressed, to complete the target formation process, and finally can be washed in a solvent to remove remaining surface salt, or else can be heated under full or partial vacuum to a temperature above 800° C. to evaporate any remaining surface salt.

EXAMPLE 6

A mixture comprising the metal halides silicon tetrachloride and trichlorosilane, and potentially hydrogen chloride and/or other silicon chlorides, is injected as a liquid into a stoichiometric excess of molten sodium, at a temperature in the range of 150° C. to 700° C.

The metal particles thus produced are silicon metal, coated in sodium chloride. The metal particles can be separated from the molten sodium, for example by passing the sodium through a filter of a size effective in the separation of the molten sodium from the salt-coated metal particles. Typically the metal particles thus produced will contain at least one percent sodium by weight.

The sodium can be removed by evaporation, either under vacuum or under a flow of inert gas, at temperatures above 500° C.

The metal particles can then be treated to remove the salt coating. This can be accomplished in several ways. For example, the salt can be removed by washing with a suitable solvent such as water, ammonia, or other polar solvents. The salt can also be removed by heating the salt-coated particles to above the melting point of the salt and then filtering the metal particles, for example on a belt filter to remove the molten salt. The salt coating can also be removed by applying pressure to the metal powder, thus causing the salt to flow and separate from the metal powder. The salt can be removed by evaporation, by heating to temperatures above 1200° C. and applying a vacuum or an inert gas sweep. The salt can also be removed by applying combinations of the above processes. By careful treatment of the material, the level of salt can be reduced below 10 ppm, and with greater care to below 1 ppm.

Finally, if desired, the metal particles can be pressed and heated, to sinter the metal powders into a solid object of the desired shape.

The above examples are intended only to be illustrative of the wide range of metals and alloys and their applications, made accessible by the invention described herein.

What is claimed is:

1. A process for the production of powder metallurgical components comprising the steps of:
   (a) reducing a mixture of at least one metal halide by molten metal reduction of the liquid phase of the metal halide in a reductant selected from an alkali or alkaline earth metal, wherein the molten reductant is present as a stoichiometric excess to the metal halide, thereby forming reaction products in a salt coating comprising molten metal, metal halide, and free metallic reductant;
   (b) separating the reaction products formed in step (a); and
   (c) forming a metal powder from a reaction product in step (b);
   wherein the at least one metal halide mixture comprises a mixture of metal chlorides and the reductant is metallic sodium;
   wherein the process is conducted as a one-pass operation in which the molten sodium metal is reacted with a liquid metal halide and the solids are recovered with only the molten sodium metal being intentionally recirculated; and
   wherein one or more powder metallurgical components are formed from the metal powder using powder metallurgical processing techniques.

2. The process of claim 1, further comprising the step of sintering the metal powder by one of the following methods:
   (1) with the salt coating in place;
   (2) after removing the salt coating in such a manner as to avoid exposing the metal powder to deleterious gaseous contamination; or
   (3) by removing the salt coating with a suitable solvent and then processing the metal powder to remove any surface contamination brought about by exposure to the solvent.

3. The process of claim 1, wherein the reductant metallic sodium comprises at least 0.1% free metallic sodium by weight and the metal halide comprises silicon.

4. The process of claim 3, wherein the metal powder comprises silicon.

5. The process of claim 4, wherein the metallurgical component includes an anode.

6. The process of claim 3, wherein the metal powder comprises a silicon alloy.

7. The process of claim 6, wherein the metallurgical component includes an anode.

8. The process of claim 1, wherein the reductant metallic sodium comprises at least 1% free metallic sodium by weight and the metal halide comprises silicon.

9. The process of claim 8, wherein the metal powder comprises silicon.

10. The process of claim 9, wherein the metallurgical component includes an anode.

11. The process of claim 8, wherein the metal powder comprises a silicon alloy.

12. The process of claim 11, wherein the metallurgical component includes an anode.

13. The process of claim 1, wherein the metal powder comprises a valve metal or a valve metal alloy.

14. The process of claim 13, wherein the metallurgical component includes an anode.

15. The process of claim 13, wherein the valve metal or valve metal alloy is selected from the group consisting of tantalum, niobium, aluminum, and alloys thereof, and aluminum-silicon alloys.

16. The process of claim 15, wherein the powder metallurgical components are porous.

17. The process of claim 15, wherein the powder metallurgical components are non-porous.

18. A process for the production of metal powder comprising the steps of:
   (a) reducing a mixture of at least one metal halide by molten metal reduction of the liquid phase of the metal halide in a reductant selected from an alkali or alkaline earth metal, wherein the molten metal reductant is present as a stoichiometric excess of the metal halide, thereby forming reaction products comprising molten metal, metal halide, and free metallic reductant;
   (b) separating the reaction products formed in step (a); and
   (c) forming a metal powder from a reaction product in step (b);
   wherein the at least one metal halide mixture comprises a mixture of metal chlorides and the reductant is metallic sodium;
   wherein the metal powder is encapsulated in a salt; and further comprising the step of sintering the metal powder by one of the following methods:
   (d) with the salt coating in place;
   (e) after removing the salt coating in such a manner as to avoid exposing the metal powder to deleterious gaseous contamination; or
   (f) by removing the salt coating with a suitable solvent and then processing the metal powder to remove any surface contamination brought about by exposure to the solvent.

* * * * *